United States Patent [19]

Noble, Jr. et al.

[11] Patent Number: 4,675,982

[45] Date of Patent: Jun. 30, 1987

[54] METHOD OF MAKING SELF-ALIGNED RECESSED OXIDE ISOLATION REGIONS

[75] Inventors: Wendell P. Noble, Jr., Milton, Vt.; Roy E. Scheuerlein, Sunnyvale; William W. Walker, Los Gatos, both of Calif.

[73] Assignee: International Business Machines Corporation, Armonk, N.Y.

[21] Appl. No.: 793,509

[22] Filed: Oct. 31, 1985

[51] Int. Cl.$^4$ .................. H01L 21/302; H01L 21/263
[52] U.S. Cl. ..................... 29/576 B; 29/571; 29/577 C; 148/1.5; 148/187; 148/DIG. 106; 357/23.4; 357/23.9; 357/51
[58] Field of Search ............... 29/576 B, 577 C, 571; 148/1.5, 175, 187; 357/23.4, 51, 23.9

[56] References Cited

U.S. PATENT DOCUMENTS

| | | | |
|---|---|---|---|
| 3,387,286 | 6/1968 | Dennard | 340/173 |
| 3,811,076 | 5/1974 | Smith, Jr. | 317/235 R |
| 3,841,926 | 10/1974 | Garnache et al. | 148/188 |
| 4,326,329 | 4/1982 | McElroy | 29/571 |
| 4,343,079 | 8/1982 | Jochens | 29/571 |
| 4,459,740 | 7/1984 | Schwabe | 29/576 B |
| 4,462,151 | 7/1984 | Geipel, Jr. et al. | 29/576 B |
| 4,471,373 | 9/1984 | Shimizu et al. | 357/41 |
| 4,502,208 | 3/1985 | McPherson | 29/571 |
| 4,525,811 | 6/1985 | Masuoka | 365/154 |
| 4,549,340 | 10/1985 | Nagasawa et al. | 29/571 |
| 4,561,170 | 12/1985 | Doering et al. | 148/187 |
| 4,574,465 | 3/1986 | Rao | 29/571 |

OTHER PUBLICATIONS

D. L. Critchlow et al, IBM Technical Disclosure Bulletin, vol. 27, No. 11, Apr. 1985, pp. 6422–6424, "Dual ROX Dynamic RAM Array".

A. Mohsen et al, IEDM 82, pp. 610–619, "A High Density, High Performance 1T Dram Cell".

*Primary Examiner*—Upendra Roy
*Attorney, Agent, or Firm*—Stephen J. Limanek

[57] ABSTRACT

A simple process is provided for making two self-aligned recessed oxide isolation regions of different thicknesses which includes the steps of defining first and second spaced apart regions on the surface of a semiconductor substrate, forming a protective layer over the first region, forming a first insulating layer of a given thickness within the second region while the first region is protected by the protective layer, removing the protective layer from the first region and forming a second insulating layer thinner than that of the first layer within the first region. Field regions may be ion implanted prior to forming the insulating layers.

24 Claims, 9 Drawing Figures

METHOD OF MAKING SELF-ALIGNED RECESSED OXIDE ISOLATION REGIONS

TECHNICAL FIELD

This invention relates to a process for making dense integrated semiconductor structures and, more particularly, to a process for making dense integrated structures on a common substrate having an array of memory cells and peripheral semiconductor circuits.

BACKGROUND ART

Integrated semiconductor memory circuits, particularly those employing cells which include essentially a storage capacitor and a switch have achieved relatively high memory cell densities. One of the simplest circuits for providing small memory cells is described in commonly assigned U.S. Pat. No. 3,387,286 filed July 14, 1967, by R. H. Dennard. Each of these cells employs a storage capacitor and a field effect transistor acting as a switch to selectively connect the capacitor to a bit/sense line. In also commonly assigned U.S. Pat. No. 3,811,076 by W. M. Smith and U.S. Pat. No. 3,841,926 by R. H. Garnache and W. M. Smith, both filed Jan. 2, 1973, t here is disclosed a one device field effect transistor memory cell of the type described in the above identified Dennard patent which utilizes a layer of doped polysilicon and an N+ diffusion region in a P type semiconductor substrate separated by a dielectric medium disposed on the surface of the semiconductor substrate for forming the storage capacitor of the cell. The polysilicon layer extends beyond the storage capacitor to act as a field shield between adjacent cells by applying a negative bias or fixed negative potential to the polysilicon layer.

As is known, these memory arrays require peripheral circuits, such as, decoders and sense amplifiers, for writing data into and reading data out of the memory arrays. Isolation regions between devices of the peripheral circuits often have different electrical requirements, e.g., different threshold voltages, compared to the requirements of the isolation regions located between the cells of the memory array. Since in many arrays, such as, those fabricated by known polysilicon processes using a polysilicon storage capacitor plate biased at one half or less of the voltage of the voltage supply source, the threshold voltage requirement on the isolation region separating the cells, particularly between cell storage nodes, may be relaxed compared to that of the isolation separating the peripheral devices. Consequently, a thinner isolating insulation layer may be used between the cell nodes of the array than that required between the devices or transistors of the peripheral circuits. A thinner isolating insulation layer or region has the advantages of reducing the well known "bird's beak" and, thus, increasing the storage capacitor area of the cell storage nodes, and decreasing the incidence of stress and topography related defects to provide improved yield.

In IBM Technical Disclosure Bulletin, Vol. 27, No. 11, April 1985, pp. 6422–6424, an article "Dual ROX Dynamic RAM Array" by D. L. Critchlow, W. P. Noble and W. W. Walker, discloses a process for making recessed oxide isolation layers having two different thicknesses which require the use of two critically aligned masks, as do the processes described in U.S. Pat. No. 4,326, 329, filed Feb. 28, 1980, and in IEDM 82, pp. 616–619, in an article entitled "A High Density, High Performance 1 T DRAM Cell", by A. Mohsen et al.

Commonly assigned U.S. Pat. No. 4,462,151, filed on Dec. 3, 1982, by H. J. Geipel, R. R. Troutman and J. M. Wursthorn, discloses a semiconductor process wherein openings are formed in a layer of silicon nitride with a single mask to define a plurality of spaced apart elements along the surface of the substrate and then one of the openings is protected by a later of material. However, there is no teaching to form within these openings insulating layers having different thicknesses.

U.S. Pat. Nos. 4,471,373, filed on Jan. 7, 1981, and 4,525,811, filed on Jan. 29, 1982, teach growing a first gate oxide layer and subsequently growing a second gate oxide layer of different thickness than the first oxide layer for field effect transistors.

DISCLOUSRE OF THE INVENTION

It is an object of this invention to provide a process for making two self-aligned recessed oxide isolation regions of different thicknesses in a semiconductor structure wherein, e.g., a thin self-aligned recessed oxide isolation region is provided between cell storage nodes in a memory array formed in a semiconductor substrate and a thicker self-aligned recessed oxide isolation region is provided between devices or transistors of peripheral circuits located in the same semiconductor substrate.

In accordance with the teachings of this invention, a process is provided for making two self-aligned recessed oxide isolation regions of different thicknesses which includes the steps of defining first and second spaced apart regions on the surface of a semiconductor substrate, forming a protective layer over the first region, forming a first insulating layer within the second region while the first region is protected by the protective layer, removing the protective layer from the first region and forming a second insulating layer within the first region.

The foregoing and other objects, features and advantages of the invention will be apparent for the following and more particular description of the preferred embodiments of the invention, as illustrated in the accompanying drawings.

BEST MODE FOR CARRYING OUT THE INVENTION

Figure 1:
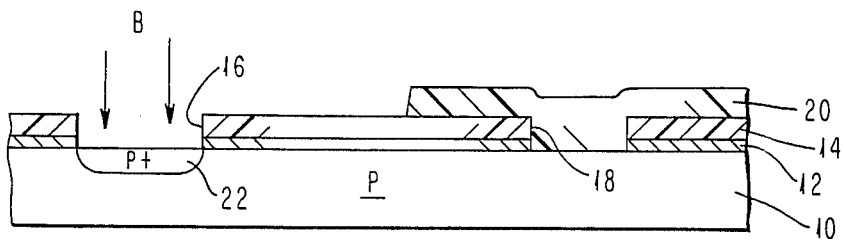
FIGS. 1–5 are sectional views of the semiconductor structure made after successive steps during the process of one embodiment of the present invention.
Figure 2:
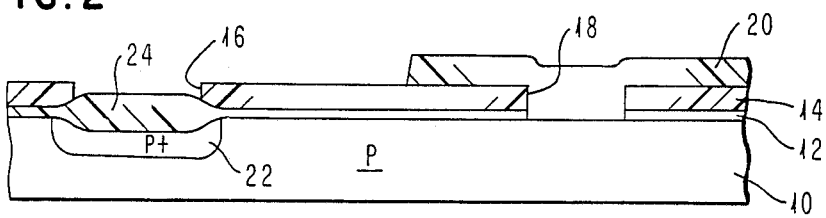
Figure 3:
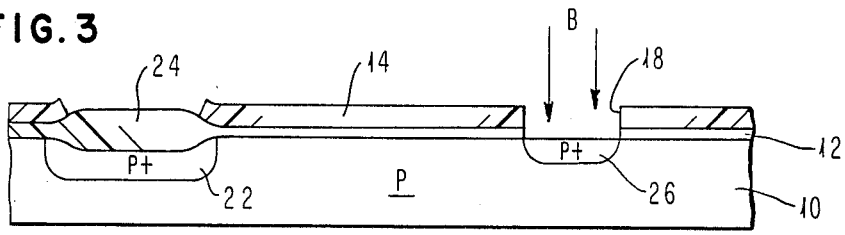
Figure 4:
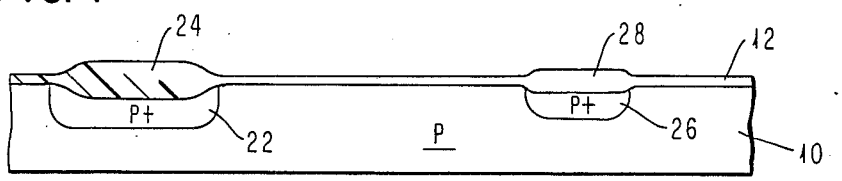

Referring to the drawings in more detail, there is illustrated in FIG. 1 a sectional view of the semiconductor structure made in accordance with the process of the present invention during an early stage of the fabrication thereof. The structure includes a semiconductor substrate 10, preferably made of silicon and having a P type conductivity. A thin layer 12 of silicon dioxide is grown on the substrate 10 and a layer of silicon nitride 14 is deposited, preferably by known low pressure chemical vapor deposition techniques, on the silicon dioxide layer 12. A conventional recessed oxide (ROX) mask is placed over a layer of photoresist (not shown) for forming with the use of suitable etchants first and second openings 16 and 18 in the layers of silicon dioxide 12 and silicon nitride 14. A layer of magnesium oxide, or other suitable oxidation resistant material, is deposited over the silicon nitride layer 14 and into the openings 16 and 18. A block mask (not shown) is then used to form a segment 20 of magnesium oxide (MgO) over and within the opening 18, as illustrated in FIG. 1 of the drawing. Boron, B, ions are implanted through the opening 16 into the substrate 10 to form a P+ field region 22 for peripheral devices. If desired, however, the boron B may be implanted prior to the deposition of the magnesium oxide through openings 16 and 18 to simultaneously form field regions for both the peripheral circuits and the memory array circuits. Next, a first recessed oxide (ROX) layer 24 is grown within the opening 16 over the field region 22, as indicated in FIG. 2 of the drawings, by known thermal oxidation techniques. The thickness of the first recessed oxide layer 24 may be, e.g., 0.3 micrometers. The magnesium oxide segment 20 is stripped by using any known appropriate etchant, such as oxalic acid, and a shallow P+ field region 26 is formed at the surface of the substrate 10 for the memory array circuits by implanting boron, B, ions therein through the opening 18, without affecting the peripheral circuit field region 22 which is now protected by the thick recessed oxide layer 24, as indicated in FIG. 3 of the drawings. A second recessed oxide layer 28 is grown within the opening 18 over the field region 26, as indicated in FIG. 4 of the drawings, by thermal oxidation techniques. The thickness of the second recessed oxide layer 28 may be, e.g., 0.1 micrometers. It should be noted that this latter thermal oxidation step slightly increases the thickness of the peripheral device recessed oxide layer 24 to its required value while forming the thinner recessed oxide layer 28. The remainder of the layer of silicon nitride 14 is stripped by using any known suitable etchant to provide the structure shown in FIG. 4.

It should be noted, however, that, if desired, the field regions 22 and 26 may be of the same or opposite conductivity type, e.g., region 26 may be a P+region and region 22 may be an N+region, formed by implanting phosphorous ions through the opening 18, as might be required in the complementary metal oxide semiconductor (CMOS) technology, with the substrate 10 of P or N conductivity type.

Figure 5:
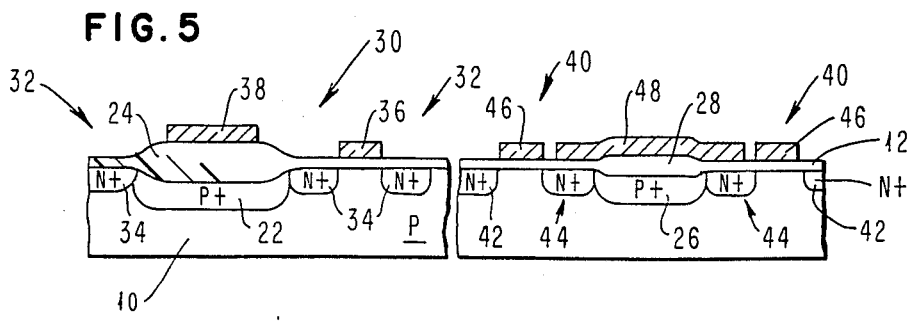

As indicated in FIG. 5 of the drawings, peripheral circuits 30 including devices or transistors, such as transistors 32 each having source and drain regions 34 and control gates 36, and conductive interconnection lines 38, which may be made of doped polysilicon, utilize the required thick recessed oxide layer 24 for isolation purposes, whereas, the cells of the memory array, such as the known one device cells 40 each having a bit/sense line 42, a storage capacitor 44 and a control gate 46, along with field shields or voltage biasing plates 48, which may also be made of doped polysilicon, utilize the thinner recessed oxide layer 28 for isolation purposes.

Thus, it can be seen that self-aligned recessed oxide isolation regions of different thicknesses have been provided on a common semiconductor substrate wherein the thickness of one of the isolation regions may be made optimum for peripheral circuit devices, while other circuits, such as memory cell circuits, are provided with a thinner isolation region which is optimum for carrying out their functions. Accordingly, the density of the memory cells can be significantly increased without adversely affecting the operation of the peripheral circuits.

Figure 6:
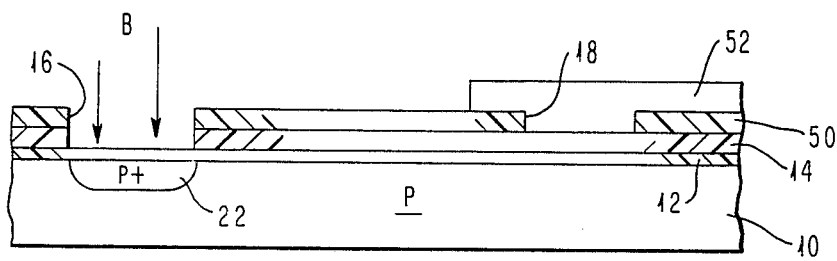
FIGS. 6–8 are sectional views of the semiconductor structure made after successive steps during the process of another embodiment of the present invention.
Figure 7:
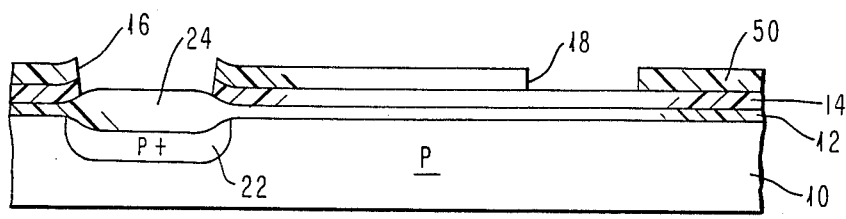
Figure 8:
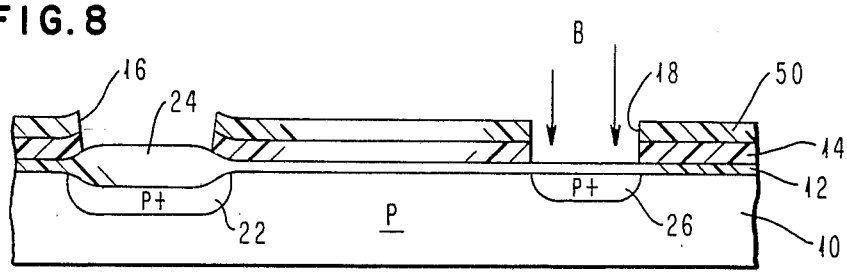

A process in accordance with a second embodiment of this invention is indicated in FIGS. 6, 7 and 8 of the drawings. In this second embodiment the semiconductor substrate 10 is covered with successive layers of silicon dioxide 12, silicon nitride 14 and magnesium oxide 50 before using a recessed oxide mask to form the openings 16 and 18 in the magnesium oxide layer 50. A layer of photoresist is then deposited over the layer of magnesium oxide 50 and into the openings 16 and 18. A block mask is used to form a segment 52 of the photoresist layer over and within the opening 18, as illustrated in FIG. 6 of the drawings. The silicon nitride layer 14 within the opening 16 is etched out and boron, B, ions are implanted through the opening 16 into the substrate 10 to form the field region 22 for peripheral devices. The photoresist segment 52 is removed and the first recessed oxide layer 24 is grown within the opening 16 to provide the isolation region for the peripheral circuits, while the substrate surface to be used for the memory array is protected by the silicon nitride layer 14. To provide the memory array field region 26, the layer of silicon nitride 14 within the opening 18 is etched out and boron (B) ions are implanted into the surface of the substrate 10 through the opening 18. The thinner recessed oxide layer 28, shown in FIG. 4 of the drawings is then grown in the same manner as described hereinabove in connection with the first process illustrated in FIGS. 1-5 of the drawings. After stripping the remaining portions of the silicon nitride and magnesium oxide layers 14 and 50, respectively, a similar structure to that illustrated in FIG. 4 of the drawings is obtained in which peripheral and memory array circuits may be made as described hereinabove in connection with FIG. 5 of the drawings.

Figure 9:
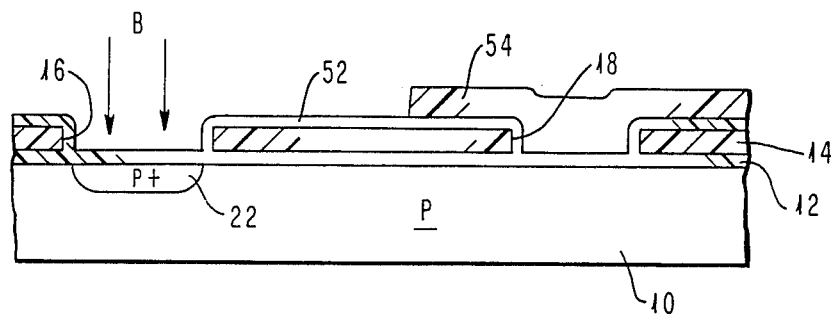
FIG. 9 is a sectional view of the semiconductor structure made after a step during the process of a further embodiment of the present invention.

A process in accordance with a third embodiment of the present invention is indicated in FIG. 9 of the drawings. As illustrated in FIG. 9, the openings 16 and 18 are formed in the first silicon nitride layer 14. Then a layer of chemically vapor deposited silicon dioxide 52 is deposited over the surface of the silicon nitride layer 14 which is followed by the deposition of a second layer of silicon nitride. By using a block mask and a suitable etchant a segment 54 of the second layer of silicon nitride is provided to protect the opening 18 while the peripheral circuit field region 22 is being formed, as well as the first thicker recessed oxide layer. After removing the silicon nitride segment 54, the field region and the thinner recessed oxide layer may be formed at the opening 18 as described hereinabove in connection with the process illustrated in FIGS. 1-5 of the drawings.

It should be noted that by the use of the present invention the thinner second recessed oxide layer 28 may have a thickness of approximately one-third that of the thicker first recessed oxide layer 24. With a bird's beak proportional to the as-grown recessed oxide (ROX) thickness, the savings in isolation area amounts to approximately 0.25 to 0.40 micrometers per edge in a typical recessed oxide process. Thus, for a one device dynamic random access memory cell, the thinner recessed oxide layer provides a one-third increase in storage cell capacitance for a given memory cell area, or the memory array area may be reduced significantly.

Accordingly, a method has been described for fabricating on a common semiconductor substrate self-aligned recessed oxide isolation regions having independent isolation thicknesses and field doping concentrations to provide more effective use of semiconductor substrate surface area.

Although specific materials have been identified in the hereinabove described embodiments, it should be understood that other known materials, e.g., an N type semiconductor substrate with N+ field region formed by implanting arsenic, may be used in the practice of this process invention. Also, other oxidation resistant materials, such as tantalum pentoxide, $TA_2O_5$, may be used in place of the magnesium oxide or silicon nitride.

While the invention has been particularly shown and described with reference to preferred embodiments thereof, it will be understood by those skilled in the art that various changes in form and details may be made therein without departing from the spirit and scope of the invention.

What is claimed is:

1. A method of making a semiconductor structure which includes the steps of
    defining with a given mask first and second spaced apart regions at the surface of a semiconductor substrate,
    forming a protective layer over said first region,
    forming a first insulating layer within said second region while said first region is protected by said protective layer,
    removing said protective layer from said first region, and
    forming a second insulating layer within said first region.

2. A method as set forth in claim 1 further including the step of implanting ions into at least one of said first and second regions prior to forming the respective insulating layer.

3. A method as set forth in claim 1 wherein said first insulating layer has a thickness substantially greater than that of said second insulating layer.

4. A method as set forth in claim 1 wherein said protective layer is silicon nitride.

5. A method as set forth in claim 2 wherein said semiconductor substrate is made of silicon having a P type conductivity and said ions are boron ions.

6. A method as set forthin claim 3 further including the steps of forming a current carrying conductive layer over said first insulating layer, forming first and second diffusion regions in said substrate adjacent opposite edges of said second region and forming third and fourth diffusion regions in said substrate adjacent opposite edges of said first region, whereby transistors may be formed at the opposite edges of said second region and capacitors may be formed at the opposite edges of said first region in said semiconductor substrate.

7. A method as set forth in claim 6 wherein said substrate is made of silicon having a P type conductivity, said first and second spaced apart regions are of a P type conductivity having an impurity concentration higher than that of said substrate and said first, third and fourth diffusion regions having an N type conductivity.

8. A method as set forth in claim 7 further including the step of depositing a conductive material over said second insulating layer, whereby said conductive material is capacitively coupled to said third and fourth diffusion regions.

9. A method of making a semiconductor structure which includes the steps of
    forming a first insulating layer on a semiconductor substrate,
    forming a second insulating layer on said first insulating layer,
    forming simultaneously first and second spaced apart openings in said insulating layers,
    forming a protective layer within said second opening,
    forming a third insulating layer within said first opening while said protective layer is disposed within said second opening,
    removing said protective layer from said second opening, and
    forming a fourth insulating layer within said second opening.

10. A method as set forth in claim 9 wherein said fourth insulating layer is formed to a thickness which is substantially less than that of said third insulating layer.

11. A method as set forth in claim 9 further including the step of implanting ions through at least one of said first and second openings into said substrate prior to forming said third and fourth insulating layers.

12. A method as set forth in claim 11 wherein said substrate is made of silicon having a P type conductivity, said ions are of a P type conductivity, said first, third and fourth insulating layers are grown from said silicon, said second insulating layer is formed by depositing silicon nitride and said protective layer is made of magnesium oxide.

13. A method as set forthin claim 12 further including the step of forming a layer of doped polysilicon over each of said third and fourth insulating layers and forming diffusion regiions of opposite conductivity type to said implanted ions in said substrate adjacent opposite edges of said third and fourth insulating layers.

14. A method of making a semiconductor structure which includes the steps of
    forming a first layer of insulation on a semiconductor substrate,
    forming a second layer of insulation on said first layer of insulation,
    forming a third layer of insulation on said second layer of insulation,
    forming simultaneously first and second spaced apart openings in said third insulating layer,
    forming an opening in said second insulating layer defined by said first opening in said third insulating layer,
    forming a fourth layer of insulation within said first opening,
    formiing an opening in said second insulating layer defined by said second opening in said third insulating layer, and
    forming a fifth layer of insulation within said second opening.

15. A method as set forth in claim 16 wherein said fifth layer of insulation is formed to a thickness which is substantially less than that of said fourth layer of insulation.

16. A method as set forth in claim 15 further including the steps of implanting ions through at least one of said first and second openings into said substrate prior to forming said fourth layer of insulation.

17. A method as set forth in claim 15 wherein said substrate is made of silicon, said first, fourth and fifth layers of insulation are grown from said silicon, said second layer of insulation is formed by depositing silicon nitride and said third layer of insulation is formed by depositing a layer of magnesium oxide.

18. A method as set forth in claim 16 further including the step of forming a protective layer over said first opening prior to implanting said ions.

19. A method as set forth in claim 18 wherein said protective layer is a layer of photoresist.

20. A method of making a semiconductor structure which includes the steps of
   forming a first layer of insulation on a semiconductor substrate,
   forming a second layer of insulation on said first layer of insulation,
   forming simultaneously first and second spaced apart openings in said second layer of insulation,
   depositing a third layer of insulation on the surfaces of said second layer of insulation,
   forming a protective layer within said second opening,
   forming a fourth layer of insulation within said first opening,
   removing said protective layer, and
   forming a fifth layer of insulation within said second opening.

21. A method as set forth in claim 20 wherein said fifth layer of insulation is formed to a thickness which is substantially less than that of said fourth layer of insulation.

22. A method as set forth in claim 21 further including the steps of implanting ions through at least one of said first and second openings into said substrate prior to forming said fourth layer of insulation.

23. A method as set forth in claim 21 wherein said substrate is made of silicon, said first, fourth and fifth layers of insulation are grown from said silicon, said second layer of insulation and said protective layer are formed by depositing silicon nitride and said third layer of insulation is formed by depositing silicon dioxide.

24. A method of making a semiconductor structure which includes the steps of
   defining first and second spaced apart regions at the surface of a semiconductor substrate,
   forming a protective layer over said first region, said protective layer being made of magnesium oxide,
   forming a first insulating layer within said secod region while said first region is protected by said protective layer,
   removing said protective layer from said first region, and
   forming a second insulating layers within said first region.

* * * * *